United States Patent

[11] 3,581,222

[72] Inventor Duane E. Dunwoodie
Los Altos, Calif.
[21] Appl. No. 808,471
[22] Filed Mar. 19, 1969
[45] Patented May 25, 1971
[73] Assignee Wilton Company
Palo Alto, Calif.

[54] LINEAR VOLTAGE CONTROLLED ATTENUATOR
8 Claims, 4 Drawing Figs.

[52] U.S. Cl. .......... 330/29, 307/235, 329/101, 329/192, 330/30, 332/31, 332/38
[51] Int. Cl. .......... H03g 3/30
[50] Field of Search .......... 332/31 (T), 37, 38, 43 (B); 329/101—103, ; 330/30 (D), 29; 307/235

[56] References Cited

UNITED STATES PATENTS

| | | | |
|---|---|---|---|
| 3,315,089 | 4/1967 | Mayne.......... | 330/30(D)X |
| 3,323,078 | 5/1967 | Falk .......... | 332/31(T) |
| 3,387,222 | 6/1968 | Hellwarth et al. .......... | 307/235X |
| 3,413,492 | 11/1968 | Schneider.......... | 307/235 |
| 3,454,893 | 7/1969 | Goordman .......... | 330/30(D) |

*Primary Examiner*—Alfred L. Brody
*Attorney*—Flehr, Hohbach, Test, Albritton & Herbert

ABSTRACT: A voltage controlled attenuator for use in an automatic gain control circuit. The attenuator includes a first transistor having a relatively high output impedance driven by an AC input signal. Its collector output is coupled to the coupled emitter inputs of two common base connected amplifiers which are differentially driven by a control signal to split the output current of the first transistor between them. The output voltage which is attenuated in proportion to the control signal is then taken from the collector of one of the common base amplifiers.

INVENTOR.
DUANE E. DUNWOODIE
BY
Flehr, Hohbach, Test, Albritton & Herbert
ATTORNEYS

LINEAR VOLTAGE CONTROLLED ATTENUATOR

BRIEF DESCRIPTION OF THE INVENTION

The present invention is directed to a voltage controlled attenuator and more particularly to an attenuator for use in an automatic gain control circuit or as an amplitude modulated transmitter.

Modulators when used in amplitude modulated transmitter systems normally require a feedback loop to correct nonlinearities. In addition, because of the nonlinearities the dynamic range of the system is limited along with the frequency range and the signal amplitude range.

The same effects are also present in automatic gain control circuits used, for example, in amplitude modulation receivers where the frequency range of operation and linearity are limiting factors.

OBJECTS AND SUMMARY OF THE INVENTION

It is, therefore, a general object of the invention to provide an improved voltage controlled attenuator which is useful as an AM transmitter or in an automatic gain control circuit.

It is another object of the invention to provide a voltage controlled attenuator as above which has a wide dynamic range, linear control, will process relatively large signals with low distortion and has a wide frequency range of operation.

In accordance with the above object there is provided a voltage controlled attenuator including first transistor means having input and output terminals. The input terminal of the transistor receives an AC input signal and the output terminal has an output signal current with an instantaneous magnitude of the AC input signal. In addition, the output terminal has a relatively high output impedance. Second and third transistors are provided with two similar terminals coupled together and to the output terminal of the first transistor. Such terminals of the two transistors have a relatively low input impedance whereby the ratio of the high output impedance of the first transistor means and the input impedance is large so that nonlinearities in the input impedance are in effect eliminated by the relatively linear high output impedance of the first transistor means. Means are provided for coupling a control signal to the second and third transistors for differentially controlling the output signal current through the transistors. Finally, output voltage means are coupled to an output terminal to one of these second and third transistors having an output voltage with a magnitude proportional to the control signal voltage.

DETAILED DESCRIPTION OF THE PREFERRED EMBODIMENT

Figure 1:
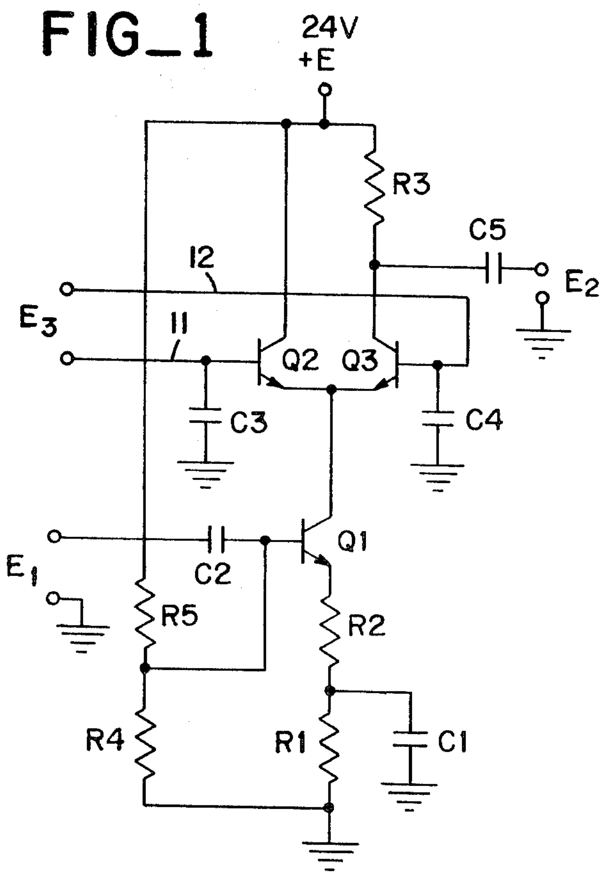
FIG. 1 is a schematic circuit embodying the present invention.

Referring now to FIG. 1, first transistor means including a transistor Q1 has an input terminal which couples to an AC input signal $E_1$. This input signal is coupled through to the base of Q1 through an AC coupling capacitor C2 which blocks any DC signals. The emitter of Q1 is grounded through series connected resistors R1 and R2. The junction of R1 and R2 is also coupled to an AC ground through a capacitor C1. Biasing for the base of Q1 is provided by a tap connection to series connected resistors R4 and R5 which are coupled between ground and a positive DC voltage source which may have a nominal value of, for example, 24 volts.

The collector terminal of transistor Q1 provides an output signal which is current coupled to the emitters of transistors Q2 and Q3. Such output signal current has an instantaneous magnitude proportional to the instantaneous magnitude of the AC input voltage $E_1$. Since the collector terminal of Q1 serves as an output terminal a relatively high output impedance is provided by the transistor means including transistor Q1, with respect to transistors Q2 and Q3. As is well known in the art, the high impedance collector output of a transistor is relatively linear over wide frequency ranges.

Transistors Q2 and Q3 constitute second and third transistors which are in a grounded base or common base amplifier configuration where their bases are common to both the collector and emitter terminals. The grounded base configuration provides a relatively low input impedance at the emitter terminals. These terminals are coupled together and to the output collector terminal of transistor Q1. The relatively large ratio of the high output impedance of transistor Q1 and the low input impedance at the emitters of transistors Q2 and Q3 in effect eliminate the normal nonlinearities in the emitter or input impedance of the transistors Q2 and Q3. In other words, the relatively large output impedance of Q1 swamps out the low input impedance of Q2 and Q3.

The collectors of Q2 and Q3 are coupled to the +E voltage source with the collector of Q3 being coupled through a resistor R3 which serves as an output load resistor for an output voltage $E_2$. The base of Q3 is coupled to ground through a capacitor C4 which acts as an AC short circuit and similarly the base of Q2 is coupled to ground through a capacitor C3.

Means for coupling a control signal to the second and third transistors Q2 and Q3 for differentially controlling the output signal current of Q1 through the transistors of Q2 and Q3 include the leads 11 and 12 coupled to the base input terminals of Q2 and Q3 respectively which terminate at input terminals for the application of a control signal voltage $E_3$. Since $E_3$ is supplied across the respective bases of Q2 and Q3 an inherent differential effect is achieved in that, for example, an increase in the positive direction of the $E_3$ voltage at the base of Q3 causing an increase in current in Q3 will cause a corresponding relative negative increase in the voltage at the base of Q2 to cause a decrease in current through Q2. Thus the control voltage $E_3$ in effect determines the split-up of the current from the collector of Q1.

Figure 2:
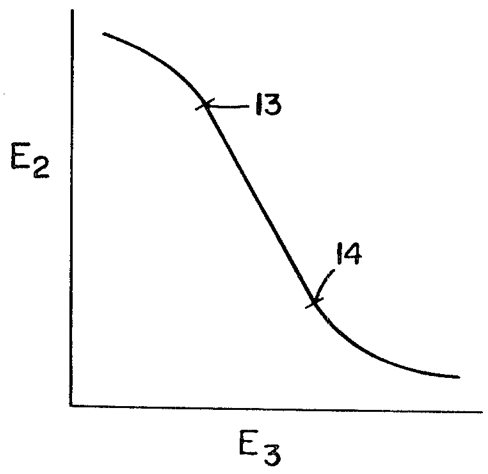
FIG. 2 is a characteristic curve useful in understanding the invention.

In operation the applied AC signal $E_1$ is attenuated by an amount controlled by $E_3$ and delivered as an output voltage $E_2$ having a magnitude proportional to the signal voltage $E_3$. Such relationship is illustrated in FIG. 2. Because of the unique circuitry of the present invention, linear operation is achieved between the indicated points 13 and 14. Such resultant characteristic is achieved in part by use of the high impedance ratio of the high output impedance of Q1 and the low emitter input impedances of Q2 and Q3. The grounded base or common base configurations of Q2 and Q3 provides a relatively lower input impedance as compared to other transistor configurations such as a common emitter amplifier configuration. However, in some applications this will also produce satisfactory results. In addition, the first transistor means which include transistor Q1 acts in effect as a constant current generator where the current through Q2 and Q3 must equal the current delivered by the collector terminal of Q1. Such output signal current from the collector Q1 is not affected by variations in the control voltage $E_3$ because of the use of a pair of transistors to always maintain the same current flow; in other words, a decrease in the amount of current through Q3 is compensated for by an increase in Q2 to maintain the same current flow and therefore reduce nonlinearities in the circuit.

The differential control by the control voltage $E_3$ with respect to transistors Q2 and Q3 may alternatively be achieved by coupling the base input terminals of Q2 and Q3 to ground with a fixed bias on one base input terminal and the control voltage $E_3$ supplied to the other. A change of the control voltage to one transistor, for example Q3, would still cause corresponding differential change in bias voltage to transistor Q2.

The resistors R2 and R3 establish the minimum attenuation limit or maximum gain of the circuit where gain equals R3/R2; thus when R2 is equal to R3 approximately unity transmission will result. Also by keeping the peak values of $E_1$ relatively small compared to the direct current drop across resistor $R_2$, any modulation of current from Q1 is small compared to the average DC value thus improving the linearity of modulation.

The present circuit illustrated in FIG. 1 functions over a broad range of frequencies being limited only by the exclusion of direct current at the low frequency end of the operating range and by the alpha cutoff of the transistors selected at the high frequency end of the operating range. Thus, conventional transistors function well in the circuit.

Figures 3, 4:
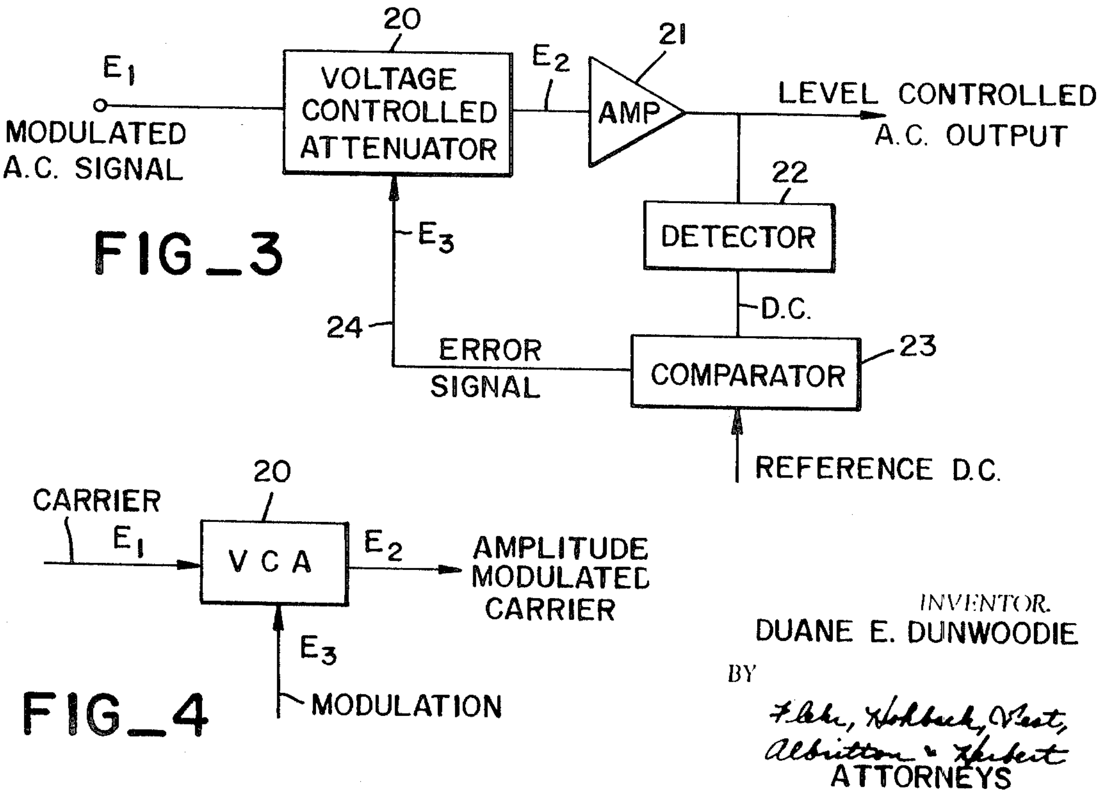
FIG. 3 is a block diagram embodying the present invention.
FIG. 4 is a block diagram illustrating an alternate use of the invention.

FIG. 3 illustrates a specific use of the present invention in an automatic gain control circuit where the voltage controlled attenuator shown in FIG. 1 is designated 20. The various input and output voltages, $E_1$, $E_2$ and $E_3$ are correspondingly indicated. When used in an automatic gain control configuration the $E_1$ input signal is a modulated AC signal which would, for example, have audio modulation on it as, for example, an amplitude modulated radio signal. The output signal $E_2$ would, of course, be a replica of the modulated AC input signal except as attenuated by the control voltage $E_3$. The output signal $E_2$ is coupled through an amplifier 21 and through a detector 22 which has an output the average DC level of the $E_2$ signal. This is compared in a comparator 23 to a reference DC level, as indicated, and an error signal is produced on line 24 which serves as the input control signal $E_3$ to the voltage controlled attenuator 20. Thus, the signal at the output of amplifier 21 has a level which is maintained constant by use of voltage controlled attenuator 20. This circuit functions in the same manner with unmodulated or CW inputs to maintain constant output in spite of input variations.

FIG. 4 shows an alternative embodiment where the voltage controlled attenuator 20 is used as an amplitude modulation transmitter. Here the $E_1$ input signal is the carrier with the control signal $E_3$ providing modulation for the carrier. The output signal $E_2$ is thus an amplitude modulated carrier. When the voltage controlled attenuator 20 is used for this purpose good linearity is provided in the modulating system as is clear from the relatively linear control curve of FIG. 2. With such a system, negative feedback circuits are not necessary to correct for nonlinearities which would normally occur in a normal AM transmitter.

Other uses of the present invention include that as a multiplying element in an analog system where, for example, the voltage $E_1$ would be multiplied with voltage $E_3$ to produce the output voltage $E_2$. In addition, the attenuator 20 finds use as a measuring element with a slight modification of the circuit of FIG. 3. More specifically, signal $E_2$ would be maintained constant and the DC error signal $E_3$ measured. The AC input signal $E_1$ is then known according to the measurement of $E_3$ and the control characteristics of the voltage controlled attenuator.

Thus, the present invention provides a voltage controlled attenuator having a wide dynamic range, linear control as illustrated by the curve of FIG. 2, a relatively wide frequency range between DC and the alpha cutoff of the transistors used, and will tolerate relatively large signals with low distortion.

I claim:

1. A voltage controlled attenuator comprising, first transistor means having base input and collector output terminals and connected in a common-emitter amplifier configuration, said input terminal receiving an AC input signal and said output terminal having an output signal current with an instantaneous magnitude proportional to the instantaneous magnitude of said AC input signal, said output terminal having a relatively high output impedance, second and third transistors, two similar terminals of said second and third transistors being coupled together and to said output collector terminal of said first transistor means, said terminals of said second and third transistors having a relatively low input impedance whereby the ratio of said high output impedance of said first transistor means and said input impedance is large so that nonlinearities in said input impedance are in effect eliminated by said relatively linear high output impedance, means for coupling a control signal to said second and third transistors for differentially controlling said output signal current through said transistors, output voltage means coupled to an output terminal of one of said second and third transistors having an output voltage with a magnitude proportional to said control signal voltage.

2. A voltage controlled attenuator as in claim 1 for use in an automatic gain control circuit together with feedback control means including rectifier means coupled to said output voltage means for rectifying said output voltage, comparator means for comparing said rectified output voltage with a reference signal and producing an error signal indicative of the difference between said rectified output voltage and said reference signal said error signal serving as said control signal to said second and third transistors whereby the average DC level of said AC signal is maintained constant.

3. A voltage controlled attenuator as in claim 1 in which said second and third transistors are connected as common base amplifiers with their emitter terminals coupled together and to said output terminal of said first transistor.

4. A voltage controlled attenuator as in claim 1 in which said means for coupling said control signal to said second and third transistors include means for coupling to the base input terminal of such transistors said control signal and coupling the base input terminal of said other of such transistors to a fixed bias.

5. A voltage controlled attenuator as in claim 4 in which said second and third transistors are connected as common base amplifiers with their emitter terminals coupled together and to said output terminal of said first transistor.

6. A voltage controlled attenuator as in claim 1 where said first transistor means includes an emitter terminal and together with first and second resistors series coupled between said emitter terminal and ground, and together with capacitor means coupled to the junction of said first and second resistors to provide an AC ground for said first resistor whereby the gain of said first transistor means is proportional to the magnitude of said first resistor and the operating current of said first transistor means is established by both said first and second resistors.

7. A voltage controlled attenuator as in claim 6 in which said second and third transistors are connected as common base amplifiers with their emitter terminals coupled together and to said collector output terminal of said first transistor.

8. A voltage controlled attenuator as in claim 6 in which said means for coupling said control signal to said second and third transistors include means for coupling to the base input terminal of such transistors said control signal and coupling the base input terminal of said other of such transistors to a fixed bias.